(12) United States Patent
Tsau

(10) Patent No.: US 7,876,579 B1
(45) Date of Patent: Jan. 25, 2011

(54) ANTI-ELECTROMAGNETIC INTERFERENCE CORNER SHIELD UNIT FOR A SHIELDING DEVICE

(75) Inventor: Chang-Jie Tsau, Taipei (TW)

(73) Assignee: EZCONN Corporation, Taipei (TW)

( * ) Notice: Subject to any disclaimer, the term of this patent is extended or adjusted under 35 U.S.C. 154(b) by 0 days.

(21) Appl. No.: 12/585,714

(22) Filed: Sep. 23, 2009

(51) Int. Cl.
*H05K 9/00* (2006.01)

(52) U.S. Cl. ...................................... 361/818; 361/816

(58) Field of Classification Search ................ 361/600, 361/816, 818, 800, 794, 799; 174/35 R, 174/51, 25–262, 382, 383, 350; 439/527, 439/544, 552, 554, 578, 579; 312/257.1, 312/265.1, 265.4, 294, 296
See application file for complete search history.

(56) References Cited

U.S. PATENT DOCUMENTS

| | | | | |
|---|---|---|---|---|
| 4,588,028 A | * | 5/1986 | Marshall et al. | 165/185 |
| 4,816,613 A | * | 3/1989 | Ito et al. | 174/372 |
| 5,414,597 A | * | 5/1995 | Lindland et al. | 361/816 |
| 5,895,884 A | * | 4/1999 | Davidson | 174/372 |
| 6,121,546 A | * | 9/2000 | Erickson et al. | 174/366 |
| 6,269,008 B1 | * | 7/2001 | Hsu | 361/816 |
| 6,921,086 B2 | * | 7/2005 | Selby | 277/609 |
| 7,417,862 B2 | * | 8/2008 | Lo | 361/719 |

* cited by examiner

*Primary Examiner*—Hung S Bui
(74) *Attorney, Agent, or Firm*—Rosenberg, Klein & Lee

(57) ABSTRACT

An anti-electromagnetic interference (anti-EMI) corner shield unit for a shielding device is disclosed. The shielding device is designed for fastening to a printed circuit board and includes an upper lid and a frame, and the frame includes a plurality of sequentially connected side walls with a gap left at each joint of two adjacent side walls. The anti-EMI corner shield unit includes an L-shaped shield plate having a first and a second shield plate for mounting to an inner side of each corner of the frame formed at the joint of any two adjacent side walls, so as to completely shield the gap left at the joint; and a clip provided at a lower edge of each of the first and the second shield plate for receiving and firmly clamping on the side wall of the frame.

7 Claims, 5 Drawing Sheets

ANTI-ELECTROMAGNETIC INTERFERENCE CORNER SHIELD UNIT FOR A SHIELDING DEVICE

FIELD OF THE INVENTION

The present invention relates to a corner shield unit, and more particularly to an anti-electromagnetic interference (anti-EMI) corner shield unit for a shielding device.

BACKGROUND OF THE INVENTION

FIG. 1 shows a conventional shielding device 10, which is soldered to a printed circuit (PC) board 15 to prevent the electromagnetic wave generated by the electronic circuits on the PC board 15 from interfering with communication and human health. The shielding device 10 includes a rectangular upper lid 11 and a rectangular frame 12. The frame 12 has four side walls 13. Since any two adjacent side walls 13 are connected to each other only via a snap-fitting structure, there is a gap 14 left at every joint of two adjacent side walls 13. Total four gaps 14 are formed on the shielding device 10 to very possibly form paths via which electromagnetic wave enters into or leaks out of the shielding device 10. Leakage of electromagnetic wave is resulted from the unshielded gaps 14 and will interfere with communication and human health. Therefore, it is necessary to work out a way to shield the unshielded gaps 14 on the shielding device 10.

SUMMARY OF THE INVENTION

A primary object of the present invention is to provide an anti-EMI corner shield unit for a shielding device, so as to shield any gaps and/or openings formed on a frame of the shielding device and effectively prevent electromagnetic wave from leaking out of or entering into the shielding device.

To achieve the above and other objects, the anti-EMI corner shield unit for a shielding device according to the present invention includes an L-shaped shield plate having a first and a second shield plate for mounting to an inner side of each corner of the frame formed at the joint of any two adjacent side walls, so as to completely shield the gap and opening left at the joint; and a clip provided at a lower edge of each of the first and the second shield plate for receiving and firmly clamping on the side wall of the frame.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
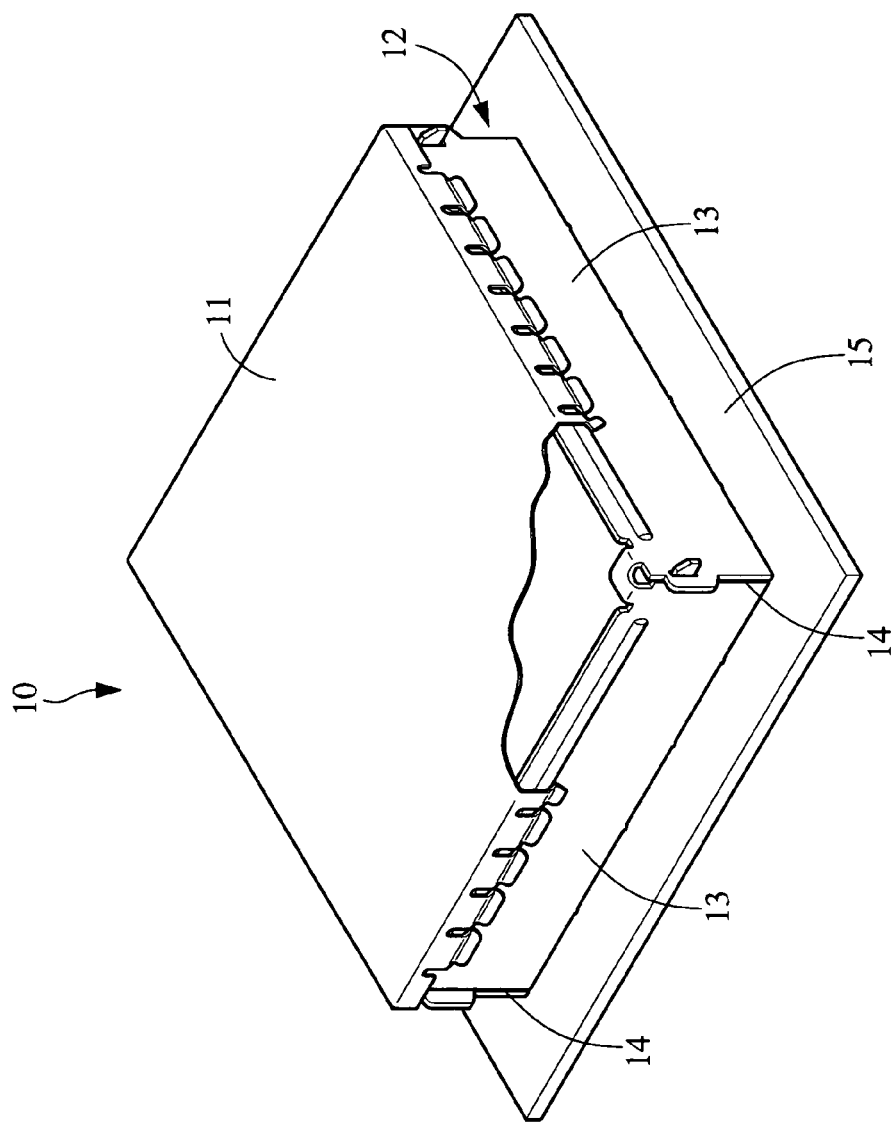
FIG. 1 is a perspective view of a conventional shielding device.
Figure 2:
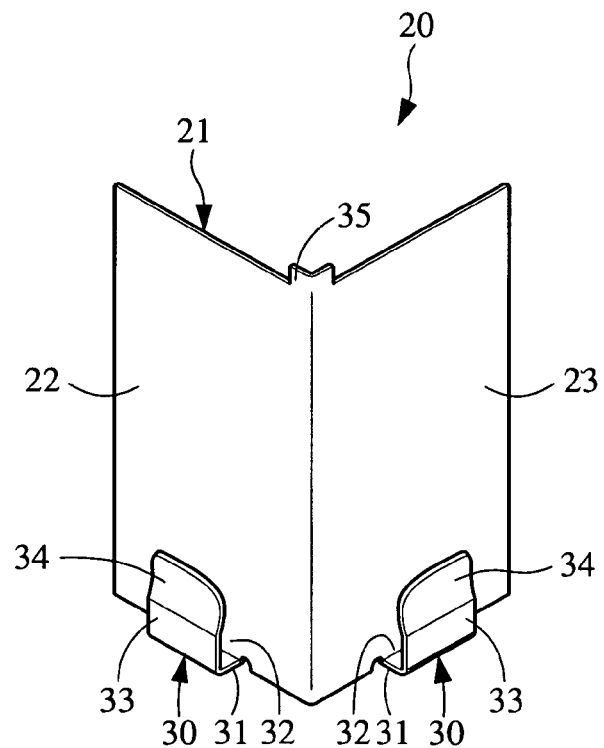
FIGS. 2 and 3 are front and rear perspective views, respectively, of an anti-EMI corner shield unit for a shielding device according to a preferred embodiment of the present invention.
Figure 3:
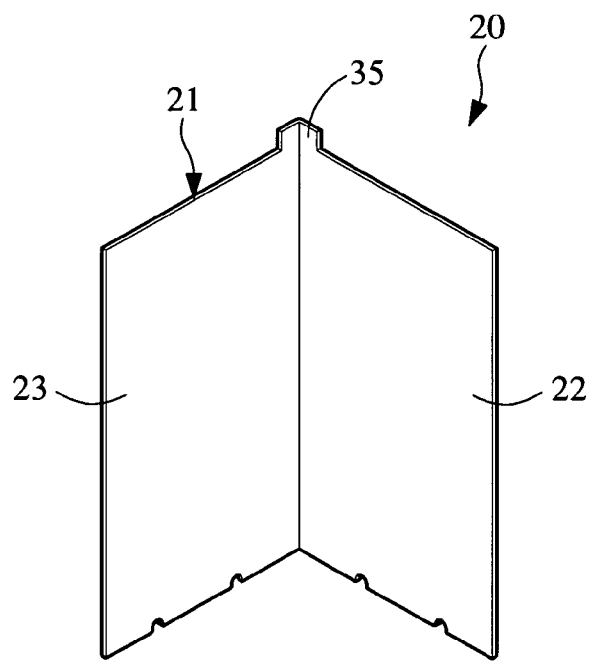
Figure 4:
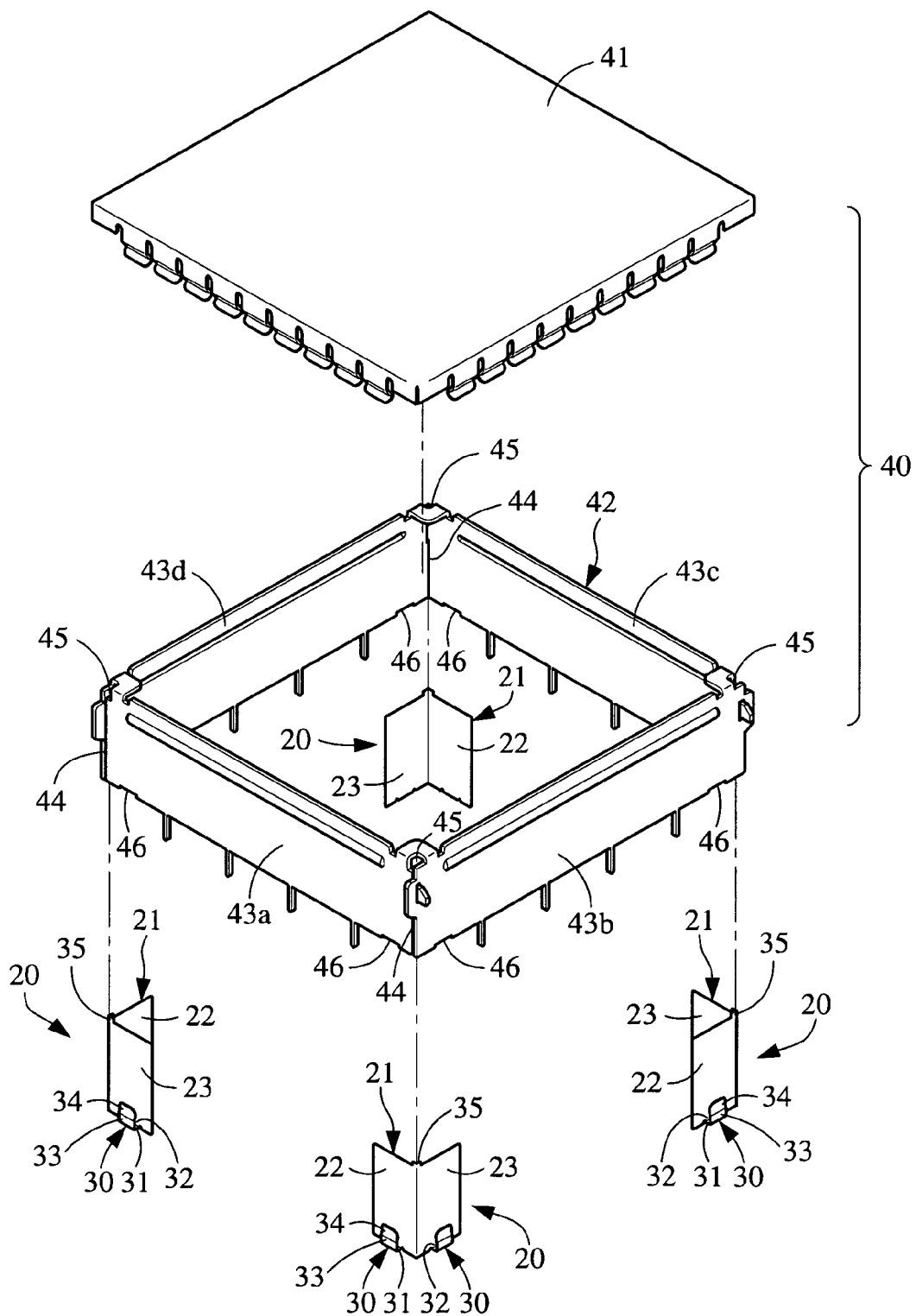
FIGS. 4 and 5 are exploded and assembled perspective views, respectively, showing the mounting of the anti-EMI corner shield unit of FIG. 2 to an inner side of every corner of a shielding device.

Please refer to FIGS. 2 and 3 that are front and rear perspective views, respectively, of an anti-EMI corner shield unit 20 according to a preferred embodiment of the present invention for shielding gaps and/or openings at every corner of a shielding device 40 illustrated in FIG. 4. The anti-EMI corner shield unit 20 includes an L-shaped shield plate 21 and a pair of clips 30. The L-shaped shield plate 21 is made of a metal material and includes a first shield plate 22 and a second shield plate 23. The L-shaped shield plate 21 also includes a projection 35 located at an upper end of a joint of the first and the second shield plate 22, 23.

Each of the clips 30 has a connecting section 31 being connected at a proximal end to a lower edge of the first or the second shield plate 22, 23; a clamping section 33 upward extended from a distal end of the connecting section 31, so that a receiving space 32 is formed between the clamping section 33 and the first or the second shield plate 22, 23; and a lip section 34 forming a free end of the clamping section 33 to bend inward toward the first or the second shield plate 22, 23. The clips 30 are integrally formed with the L-shaped shield plate 21.

Figure 5:
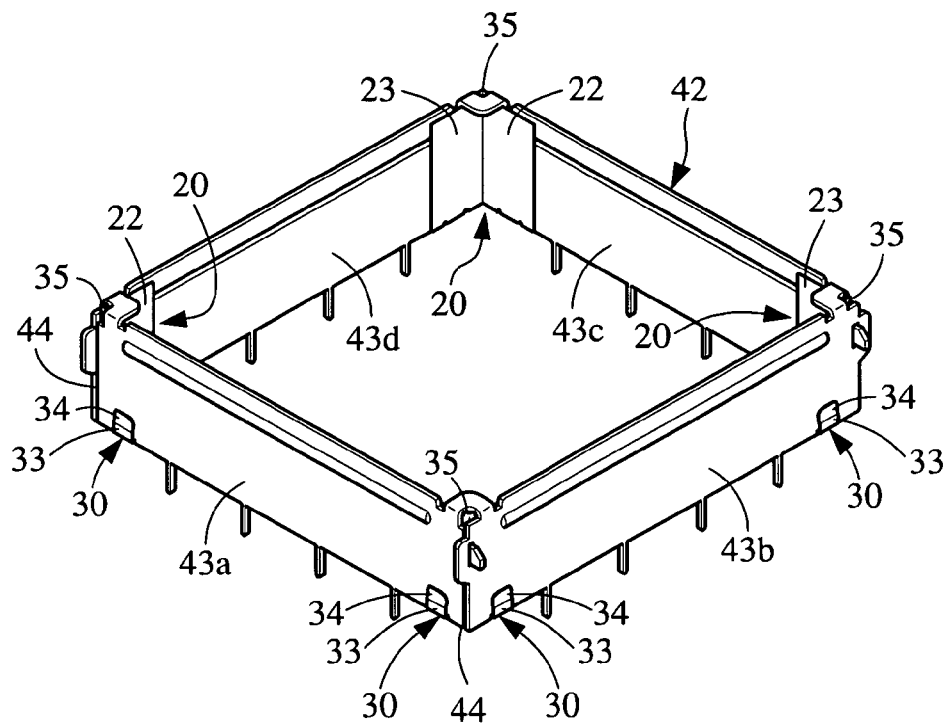

Please refer to FIGS. 4 and 5. The shielding device 40 has a shape determined according to actual need in use. In the illustrated preferred embodiment of the present invention, the corner shield unit 20 is designed for use with a rectangular shielding device 40, and the present invention is described based on the rectangular shielding device. As shown, the shielding device 40 includes a rectangular upper lid 41 and a rectangular frame 42. The frame 42 has four sequentially connected side walls 43a, 43b, 43c, and 43d. Since any two adjacent side walls 43a-43d are connected to each other only via a snap-fitting structure, a gap 44 is formed at every joint of (or every corner between) two adjacent side walls 43a-43d and an opening 45 is formed at an upper end of the joint. Two notches 46 are provided on a lower edge of the frame 42 closely at two opposite sides of every joint of two adjacent side walls 43a-43d to. The notches 46 each have a width larger than that of the connecting section 31 of the clip 30, and are located corresponding to the connecting section 31. When the L-shaped shielding plate 21 is coupled with the frame 42, the connecting sections 31 of the clips 30 are engaged with the notches 46, such that the connecting sections 31 are flush with the lower edge of the frame 42.

To shield the gaps 44 on the frame 42, four corner shield units 20 are separately mounted to four corners of the frame 42 with the first and the second shield plate 22, 23 of the L-shaped shield plate 21 bearing on the inner side of the side walls 43a-43d, and the problem of leakage of electromagnetic wave can be solved.

When the corner shield units 20 are mounted to the frame 42, the projections 35 on the L-shaped shield plates 21 are separately upward extended into the openings 45 on the frame 42, and the connecting sections 31 of the clips 30 are separately engaged with the notches 46 at the lower edge of the frame 42, such that the side walls 43a-43d of the frame 42 are received in the receiving spaces 32 between the first/second shield plates 22, 23 and the clamping sections 33 of the clips 30. Meanwhile, the lip sections 34 forming the free ends of the clamping sections 33 tightly bear against an outer side of the side walls 43a-43d. In this manner, the corner shield units 20 are firmly and stably connected to the frame 42.

Figure 6:
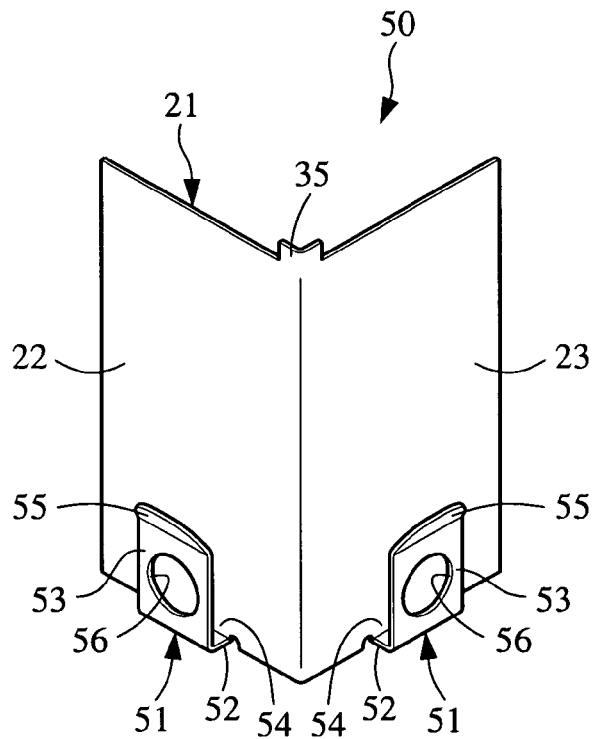
FIG. 6 is a front perspective view of an anti-EMI corner shield unit for a shielding device according to another embodiment of the present invention.

FIG. 6 shows a corner shield unit 50 according to another embodiment of the present invention. The corner shield unit 50 is generally structurally similar to the corner shield unit 20 in the first embodiment but has two differently configured clips 51. Each of the clips 51 includes a connecting section 52 being connected at a proximal end to a lower edge of the first or the second shield plate 22, 23; and a clamping section 53 upward extended from a distal end of the connecting section 52, so that a receiving space 54 is formed between the clamping section 53 and the first or the second shield plate 22, 23. An engaging hole 56 is provided on the clamping section 53, and a free end of the clamping section 53 is extended outward to provide a slant section 55.

Figure 7:
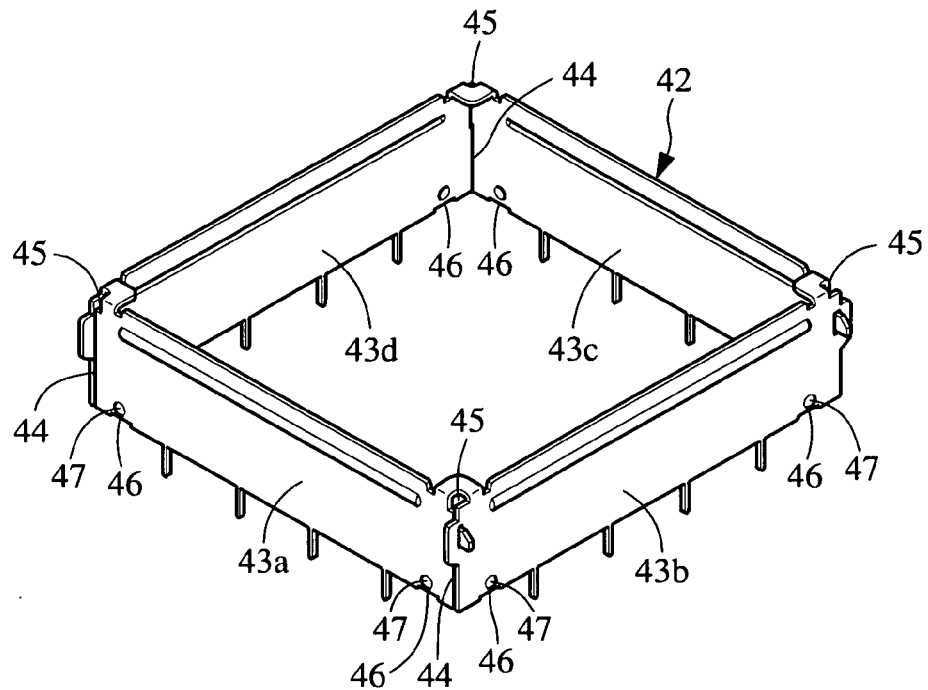
FIG. 7 is a perspective view of a frame for a conventional shielding device.
Figure 8:
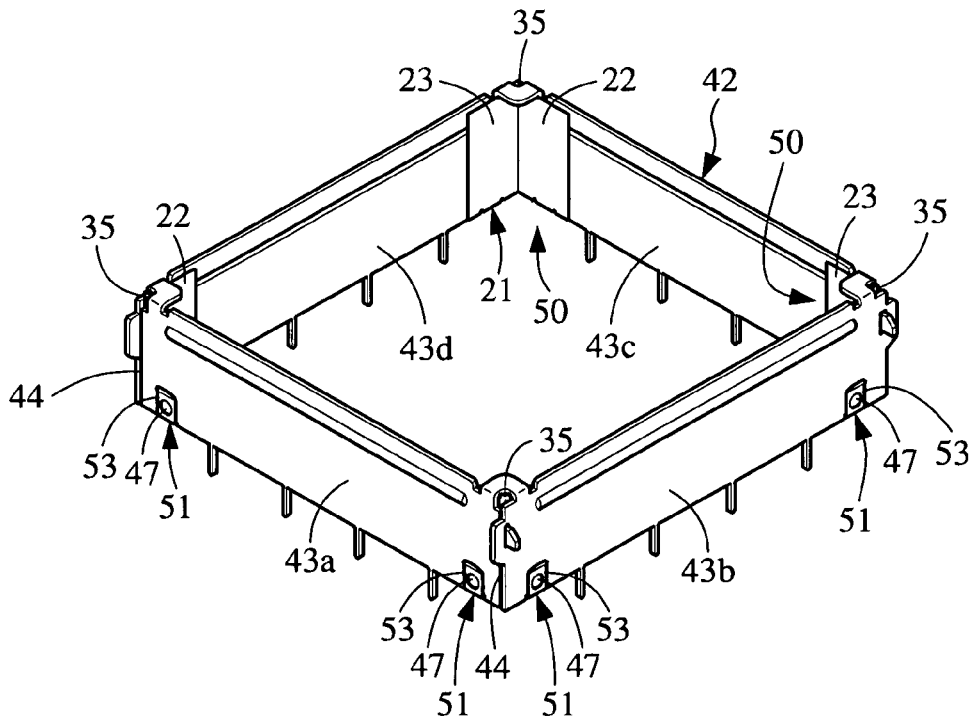
FIG. 8 is a perspective view showing the frame of FIG. 7 with the anti-EMI corner shield unit of FIG. 6 mounted to every corner thereof.

As can be seen in FIG. 7, two protrusions 47 are further provided on the frame 42 closely at two opposite sides of each of the joints of two adjacent side walls 43a-43d to correspond to the engaging holes 56 formed on the clamping sections 53 of the clips 50. Please refer to FIG. 8. To shield the gaps 44, four corner shield units 50 are mounted to the inner side of the four corners of the frame 42 with the projections 35 on the L-shaped shield plates 21 separately upward extended into the openings 45 on the frame 42. Lower edges of the side walls 43a-43d of the frame 42 are slid into the receiving spaces 54 via the slant sections 55 of the clips 51, and the connecting sections 52 of the clips 51 are separately engaged with the notches 46 at the lower edge of the frame 42. At this point, the protrusions 47 on the frame 42 are separately engaged with the engaging holes 56 on the clamping sections 53 of the clips 50. In this manner, the corner shield units 50 are firmly and stably connected to the frame 42.

In brief, the corner shield unit 20, 50 of the present invention can be mounted to the inner side of the corners of the frame 42 to completely shield the gaps 44 and the openings 45 at the joints of the side walls 43a-43d, so that the problem of leaked or invaded electromagnetic wave as found with the conventional shielding device 40 can be solved.

The present invention has been described with some preferred embodiments thereof and it is understood that many changes and modifications in the described embodiments can be carried out without departing from the scope and the spirit of the invention that is intended to be limited only by the appended claims.

What is claimed is:

1. An anti-EMI corner shield unit for a shielding device, the shielding device being designed for fastening to a printed circuit board and including an upper lid and a frame, the frame having a plurality of sequentially connected side walls with a gap left at a joint between any two adjacent side walls and an opening formed at an upper end of the joint; the corner shield unit comprising:

an L-shaped shield plate for mounting to an inner side of every corner of the frame formed at the joint of two adjacent side walls to shield the gap left thereat, and the L-shaped shield plate including a first and a second shield plate; and a clip provided at a lower edge of each of the first and the second shield plate for receiving and clamping on the side walls of the frame.

2. The anti-EMI corner shield unit for a shielding device as claimed in claim 1, wherein each of the clips includes a connecting section, a clamping section, and a lip section; the connecting sections being connected at respective proximal end to the lower edge of the first and the second shield plate, and the clamping sections being separately upward extended from distal ends of the connecting sections; and the lip sections forming free ends of the clamping sections and bent inward toward the first and the second shield plate for tightly bearing on an outer side of the side walls of the frame.

3. The anti-EMI corner shield unit for a shielding device as claimed in claim 2, wherein two notches are provided on the frame closely at two opposite sides of each of the joints of two adjacent side walls to correspond to the connecting sections of the clips.

4. The anti-EMI corner shield unit for a shielding device as claimed in claim 1, wherein each of the clips includes a connecting section and a clamping section; the connecting sections being connected at respective proximal end to the lower edge of the first and the second shield plate, and the clamping sections being separately upward extended from distal ends of the connecting sections and provided with an engaging hole each.

5. The anti-EMI corner shield unit for a shielding device as claimed in claim 4, wherein two protrusions are provided on the frame closely at two opposite sides of every joint of two adjacent side walls to correspond to the engaging holes formed on the clamping sections; and the protrusions being engaged with the engaging holes on the clamping sections of the clips to connect the L-shaped shield plate to the frame.

6. The anti-EMI corner shield unit for a shielding device as claimed in claim 4, wherein two notches are provided on the frame closely at two opposite sides of each of the joints of two adjacent side walls to correspond to the connecting sections of the clips.

7. The anti-EMI corner shield unit for a shielding device as claimed in claim 1, wherein the L-shaped shield plate includes a projection located at an upper end of a joint of the first and the second shield plate for upward extending into the opening formed at the upper end of every joint of two adjacent side walls of the frame.

* * * * *